United States Patent [19]

Tong

[11] Patent Number: 5,764,649
[45] Date of Patent: Jun. 9, 1998

[54] EFFICIENT ADDRESS GENERATION FOR CONVOLUTIONAL INTERLEAVING USING A MINIMAL AMOUNT OF MEMORY

[75] Inventor: Po Tong, Fremont, Calif.

[73] Assignee: Amati Communications Corporation, San Jose, Calif.

[21] Appl. No.: 623,965

[22] Filed: Mar. 29, 1996

[51] Int. Cl.$^6$ .................................................. G06F 11/00
[52] U.S. Cl. ...................................... 371/2.1; 371/2.2
[58] Field of Search ........................ 371/4.3, 2.2, 2.1, 371/37.5, 37.6; 375/1; 365/230.06, 200, 189.04, 189.02; 37/22; 364/728.06, 728.03; 386/49, 52, 77, 89

[56] References Cited

U.S. PATENT DOCUMENTS

| | | | |
|---|---|---|---|
| 4,559,625 | 12/1985 | Berlekamp et al. | 371/2 |
| 4,677,626 | 6/1987 | Betts et al. | 371/43.4 |
| 4,918,692 | 4/1990 | Hidaka et al. | 371/2.2 |
| 5,042,033 | 8/1991 | Costa | 371/2.1 |
| 5,056,105 | 10/1991 | Darmon et al. | 375/1 |
| 5,159,608 | 10/1992 | Falconer et al. | 375/200 |
| 5,263,051 | 11/1993 | Eyuboglu | 375/254 |
| 5,493,219 | 2/1996 | Makino et al. | 324/207.25 |
| 5,519,734 | 5/1996 | Ben-Efraim | 375/341 |
| 5,537,420 | 7/1996 | Huang | 371/2.1 |
| 5,572,532 | 11/1996 | Fimoff et al. | 37/22 |
| 5,592,492 | 1/1997 | Ben-Efraim et al. | 371/2.2 |
| 5,627,844 | 5/1997 | Cho | 371/40.1 |
| 5,636,224 | 6/1997 | Voith et al. | 371/2.1 |

FOREIGN PATENT DOCUMENTS

| | | |
|---|---|---|
| 0681373A2 | 11/1995 | European Pat. Off. |
| 0696108A1 | 2/1996 | European Pat. Off. |
| WO95/18489 | 7/1995 | WIPO |

OTHER PUBLICATIONS

John L. Ramsey, "Realization of Optimum Interleavers," May 1970, IEEE Transactions of Information Theory, Vo. IT-16, No. 3.

G. David Forney, Jr., "Burst-Correcting Codes for the Classic Bursty Channel," Oct. 1971, IEEE Transactions on Communications Technology, Vo. COM-19, No. 5.

J.T. Aslanis, P.T. Tong, T.N. Zogakis, "An ADSL Proposal for Selectable Forward Error Correction with Convolutional Interleaving," Aug. 20, 1992, T1E1.4:ADSL.

Primary Examiner—Stephen M. Baker
Assistant Examiner—McDieune L. Marc
Attorney, Agent, or Firm—Beyer & Weaver, LLP

[57] ABSTRACT

A convolutional interleaving process which utilizes an addressing scheme that enables the amount of memory to be used in the convolutional interleaving process to be reduced is disclosed. A stream of data is convolutionally interleaved at a designated interleaving depth and a designated interleaving block length such that a first symbol in a designated block has an associated predetermined delay and each subsequent symbol in the designated block has a delay equal to more than its predecessor symbol. A plurality of delay related arrays, as well as an initial value array, a lower limit array, and an upper limit array, are calculated in order to define interleaving orbits. The convolutional interleaving process is accomplished by a convolutional interleaver which is arranged to take an incoming stream of data and output an interleaved stream of bits which is conceptually partitioned into blocks. A convolutional deinterleaving process, which is similar to the convolutional interleaving process is also disclosed.

24 Claims, 12 Drawing Sheets

EFFICIENT ADDRESS GENERATION FOR CONVOLUTIONAL INTERLEAVING USING A MINIMAL AMOUNT OF MEMORY

BACKGROUND OF THE INVENTION

1. Field of Invention

The present invention relates generally to the use of convolutional interleaving in digital communication systems to improve transmission reliability. More particularly, a method of efficiently generating addresses for convolutional interleaving that utilizes a minimal amount of memory is disclosed.

2. Description of Prior Art

Digital Communication Systems that are subject to Bursty Channel Noise have frequently used the technique of "interleaving" in connection with error correction to improve the reliability of the system. By way of example, as illustrated in FIG. 1, a typical interleaving system includes an encoder 50 that encodes an incoming data stream, an interleaver 52 which interleaves the encoded signal and a modulator 53 which modulates the interleaved signal in a manner suitable for transmission over a channel 54. The encoding, interleaving, and modulating of data occur as a part of the data transmission process of the transmitter 57. The encoded interleaved signal is then received by a receiver 60 which includes a demodulator 55, a deinterleaver 62 that unscrambles the interleaving, and a decoder 64 which decodes the encoded signal. The decoded signal may then be used in any suitable manner. In effect, the interleaver permits the ordering of the sequence of symbols in a deterministic manner while the deinterleaver applies an inverse permutation to restore the sequence to its original ordering.

When describing the type of permutation implemented by an interleaver, it is convenient to divide the inputted symbol stream into blocks of data having a designated length N. An interleaving depth factor d is also defined. The most common and straight-forward interleaving scheme is known as "block" interleaving. In a block interleaver, data is written into a memory that is conceptually divided into a number of rows equal to the designated number of symbols per block N and a number of columns equal to the desired interleaving depth factor d. The data is read into the interleaver in a column-by-column fashion and is read out of the memory in a row-by-row fashion. Thus, an amount of memory equivalent to N*d is used for a single block of data. Typically, two such blocks are used to permit data to be read from one memory while the other is being written into. In the deinterleaver, the inverse permutation is accomplished by writing into the deinterleaver in a row-by-row manner and reading out of the deinterleaver in a column-by-column manner. Thus, as will be appreciated by those skilled in the art, the total amount of memory necessary to implement such a system is typically 4*N*d and the total latency through the interleaver and deinterleaver is 2*N*d.

The concept of convolutional interleaving was first introduced by J. L. Ramsey and G. D. Forney in around 1970. See, for example, J. L. Ramsey "Realization of Optimum Interleavers" IEEE Information Theory, Vol. IT-16, Number 3, May 1970, pp. 338–345; and G. D. Forney, "Burst-Correcting Codes for the Classic Bursty Channel," IEEE Trans. Communication Technology, Vol. COM-19, Oct. 1971, pp. 772–781. When convolutional interleaving is used, the total memory requirements can theoretically be reduced to approximately N*d. The reduction in memory results in a memory requirement which is one-fourth the requirement of block interleaving. At the same time, the overall latency is reduced by up to approximately the same level (i.e., N*d). This is approximately half of the total latency of a block interleaver.

The implementations of convolutional interleaving described by Ramsey and Forney as well as others are capable of achieving the reduction of required memory by up to a factor of 4 through the use of 2*N separate delay lines. Each of the delay lines can be implemented by a RAM with its own address. However, when the number of symbols in a block of data N is relatively large, a correspondingly large number of separate RAMs are required in order to implement the interleaver. In order to improve the efficiency of the system, it would be desirable to consolidate these memories into a relatively small number of RAMs.

U.S. Pat. No. 4,559,625, entitled "Interleavers for Digital Communications," issued Dec. 17, 1985 to E. R. Berlekamp, et al. describes an interleaving system that requires only one RAM for the interleaver and one additional RAM for the deinterleaver. However, in the described implementation, which is referred to as "helical" interleaving, the interleaving depth d is restricted to a value that is one greater or one less than the number of symbols in a block of data N. That is, D=N±1. Although the "helical" interleaver disclosed by Berlekamp, et al. works well in some applications, it is limited in that it cannot be used in applications which require different relationships between the interleaving depth and the number of symbols in a block of data.

More recently, J. T. Aslanis, et al. described a convolutional interleaving system that permits an arbitrary interleaving depth d wherein the only restriction on the interleaving depth d is that it must be coprimed with the number of symbols in a block of data N. The described system uses a single RAM implementation with a total memory requirement equivalent to 2*N*d. See generally, Aslanis et al. "An ADSL Proposal for Selectable Forward Error Correction with Convolutional Interleaving", TIEI.4/92-180, Aug. 20, 1992. It should be appreciated that although this system requires just half of the memory required by the block interleaver, it still requires an amount of memory which is approximately twice as high as the theoretical minimum.

In view of the foregoing, an improved convolutional interleaving scheme which further reduces the amount of memory required in a single RAM interleaver/single RAM deinterleaver application would be desirable. It would further be desirable to provide an interleaving/deinterleaving system which does not have unnecessarily stringent constraints on the permissible interleaving depths for a given number of symbols in an interleaved block of data.

SUMMARY OF THE INVENTION

To achieve the foregoing and other objects and in accordance with the purpose of the present invention, a convolutional interleaving process utilizes an addressing scheme which enables the amount of memory used to be reduced. In order to reduce the amount of memory used in an interleaving process, a stream of data is convolutionally interleaved at a designated interleaving depth and a designated interleaving block length such that a first symbol in a designated block has an associated predetermined delay and each subsequent symbol in the designated block has a delay equal to more than its predecessor symbol. A plurality of delay related arrays, which cooperate with the designated block length to define the delay associated with each symbol in a given block, as well as an initial value array, a lower limit array, and an upper limit array, are calculated in order to define interleaving orbits. In some embodiments, the plurality of delay related arrays includes two delay related arrays which are set by iterating through the two delay related arrays to sequentially set values for the elements in the two delay related arrays. The initial value, lower limit, and upper limit arrays are then used to generate a convolutional interleaving addressing scheme.

Specifically, generating a convolutional interleaving addressing scheme involves determining orbits, which require initially determining the elements in the upper limit, lower limit and initial value arrays corresponding to a first element in the designated block. The difference between the values in the upper limit and lower limit arrays which correspond to the first element in the designated block define a first orbit. If the first orbit is shared by additional elements in the designated block, the upper limit and lower limit arrays corresponding to each additional element in the designated block that is determined to share the first orbit are set such that identical values are stored in a corresponding position in the upper limit array and identical values are stored in a corresponding position in the lower limit array. Any subsequent, or additional, orbits are defined in a similar manner as the first orbit.

The initial value array defines the address at which each symbol in a block of data is written into memory by first determining whether an address for a corresponding element in a preceeding block is equal to the corresponding value in the lower limit array. Next, the address of the element in a subsequent block of data is set to the corresponding value in the upper limit array when it is determined that the address for the corresponding element in the previous block is equal to the corresponding value of the lower limit array. When it is determined that the address of the corresponding element in the previous block is not equal to the corresponding value in the lower limit array, the address of the element in the subsequent block of data is then set to a value that is indexed from the address of the corresponding element in the previous block by a designated index amount.

The convolutional interleaving process is accomplished by a convolutional interleaver which is arranged to take an incoming stream of data and output an interleaved stream of bits which is conceptually partitioned into blocks. The convolutional interleaver includes memory arranged to temporarily store received data bits during an interleaving process, an address generator arranged to generate a sequence of addresses used to write the incoming stream of data into the memory and to read the interleaved stream of bits from the memory using an upper limit array, a lower limit array and an initial value array. The addresses are generated using the steps of setting the addresses for a first received block of data equal to addresses identified in the initial value array, and for each element in each subsequent block of data, determining whether an address for a corresponding element in an immediately preceeding block is equal to a corresponding value in the lower limit array, setting the address of the element in the subsequent block of data to the corresponding value in the upper limit array when it is determined that the address for the corresponding element in the previous block is equal to the corresponding value of the lower limit array, and setting the address of the element in the subsequent block of data to a value that is indexed from the address of the corresponding element in the previous block by a designated index amount when it is determined that the address of the corresponding element in the previous block is not equal to the corresponding value in the lower limit array.

A convolutional deinterleaving process, which is similar to the convolutional interleaving process, involves convolutionally deinterleaving a stream of data at a designated interleaving depth and a designated interleaving block length such that a first symbol in a designated block has an associated predetermined delay and each subsequent symbol in the designated block has a delay equal to more than its predecessor symbol. Inverse delay related arrays, which cooperate with the designated block length, are generated to define a plurality of delay related arrays which determine the delay associated with each symbol in a given block. In some embodiments, the plurality of delay related arrays includes two delay related arrays. An initial value array, a lower limit array, and an upper limit array, are calculated in order to define interleaving orbits. The initial value, lower limit, and upper limit arrays are then used to generate a convolutional deinterleaving addressing scheme.

These and other features of the present invention will be presented in more detail in the following detailed description of the invention and in the associated figures.

BRIEF DESCRIPTION OF THE DRAWINGS

The invention, together with further objects and advantages thereof, may best be understood by reference to the following description taken in conjunction with the accompanying drawings in which.

DESCRIPTION OF THE PREFERRED EMBODIMENTS

Figure 1:
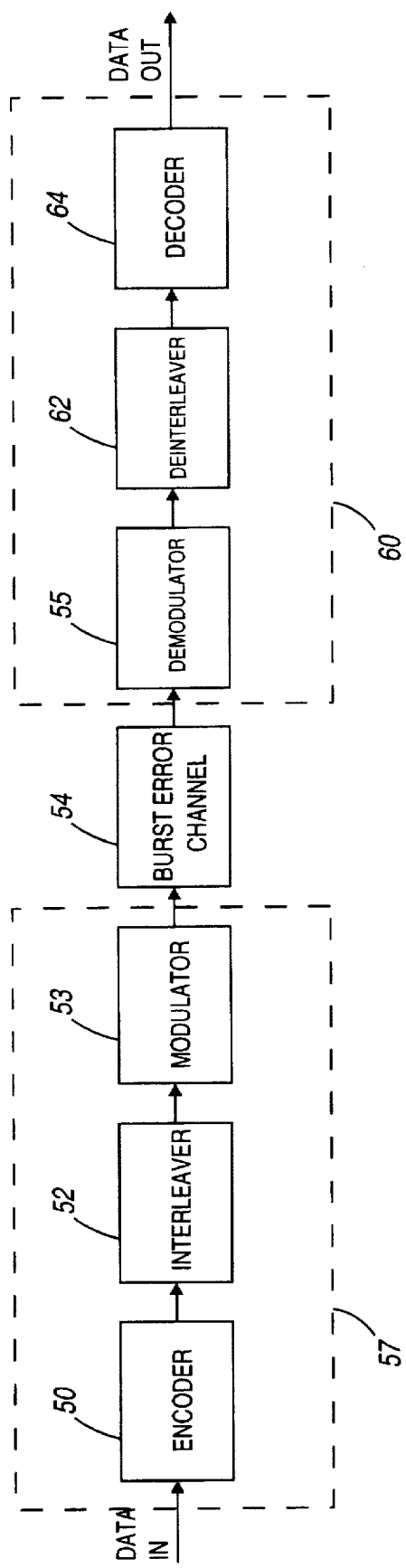
FIG. 1 is a block diagram illustrating a digital communication system that utilizes interleaving.

The present invention will now be described in detail with reference to a preferred embodiment thereof as illustrated in the accompanying drawings. As described above with reference to FIG. 1, a typical interleaving system includes an encoder 50 that encodes an incoming data stream, an interleaver 52 which interleaves the encoded signal and a modulator 53 which modulates the interleaved signal in a manner suitable for transmission over a channel 54. Thus, the encoding, the interleaving, and the modulating occur before the signal is transmitted by the transmitter 57. The encoded interleaved signal is then received by a receiver 60 which includes a demodulator 55, a deinterleaver 62 that unscrambles the interleaving and passes the deinterleaved signal to a decoder 64 which decodes the encoded signal. The decoded signal may then be used in any suitable manner. In effect, the interleaver permits the ordering of the sequence of symbols in a deterministic manner while the deinterleaver applies an inverse permutation to restore the sequence to its original ordering. Specific transmitters and receivers may include a number of other components and may not require a specific encoder/decoder or modulator/demodulator combination.

Figure 9:
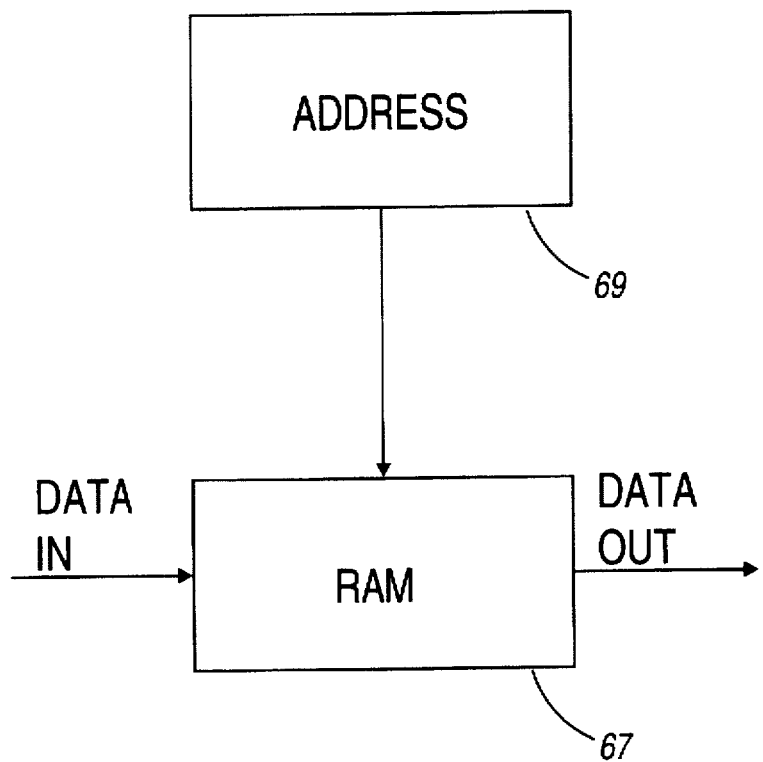
FIG. 9 is a single RAM implementation model for both the interleaver and the deinterleaver in accordance with one preferred embodiment of the present invention.

A representative single RAM interleaver or deinterleaver architecture that is suitable for use in conjunction with the present invention is schematically illustrated in FIG. 9. As seen therein, the RAM 67 is arranged to receive data in and write data out in accordance with a designated addressing sequence that is dictated by the address controller 69. The same addressing sequence is used for both writing into and reading from the RAM 67. For each address, data is read from the location specified by the address before additional incoming data is written into that location. A symbol written into a location with a specific address will be delayed until the next occurrence of the specific address is determined. In other words, given the delay and the specific write address of an input symbol, it is possible to determine the next occurrence of the specific address. By way of example, if an input symbol $I_S$ is to be delayed by $D_S$ symbols and has a specific write address $A_W$, the next occurrence of address $A_W$ will be exactly $D_S$ symbols later. This principle may be used to generate the periodic address sequence of incoming data.

A mechanism suitable for determining a suitable addressing sequence that has general applicability to interleavers and deinterleavers having a wide variety of desirable word lengths N and interleaving depths d is described below with reference to FIGS. 2–8. Once the addressing sequence has been defined, any suitable processor, as for example a microprocessor, may be used to generate the addressing sequence.

The input symbols to the interleaver are separated, or partitioned, into words, or blocks, of length N. The symbols within a word are given indices 0, 1, 2, . . . , N–1 where symbol 0 is the first symbol within a word, and symbol N–1 is the last.

Each symbol is subjected to a different delay D throughout the interleaver, with symbol i being delayed by:

$$D[i]=i*(d-1)+1.$$

As previously mentioned, d is the interleaver depth. The deinterleaver performs the inverse operation, as a symbol i which is delayed throughout the interleaver $i*(d-1)+1$ is delayed throughout the deinterleaver by:

$$D[i]=(N-1-i)*(d-1)+1.$$

The overall delay $D_{overall}$ may therefore be expressed as follows:

$$D_{overall}=(N-1)*(d-1)+2$$

In order to realize the overall delay $D_{overall}$, it follows that the minimal number of memory elements $M_{elements}$ required may be expressed by the following relationship:

$$M_{elements}=(N-1)*(d-1)+2$$

It is possible to realize the overall delay using only a minimal amount of memory. For a minimal amount of memory, the number of memory elements $M_{elements}$ required by the interleaver and the deinterleaver may be separately expressed by the following relationship:

$$M_{elements}=(N-1)*(d-1)/2+1$$

In order to achieve a significant savings in memory, that is, in order to use only a minimal amount of memory in the interleaving and deinterleaving process, a rather involved addressing scheme is required. The addressing scheme involves generating several arrays which characterize the delays relating to each symbol, as well as the addresses for both the interleaver and the deinterleaver.

Figure 2:
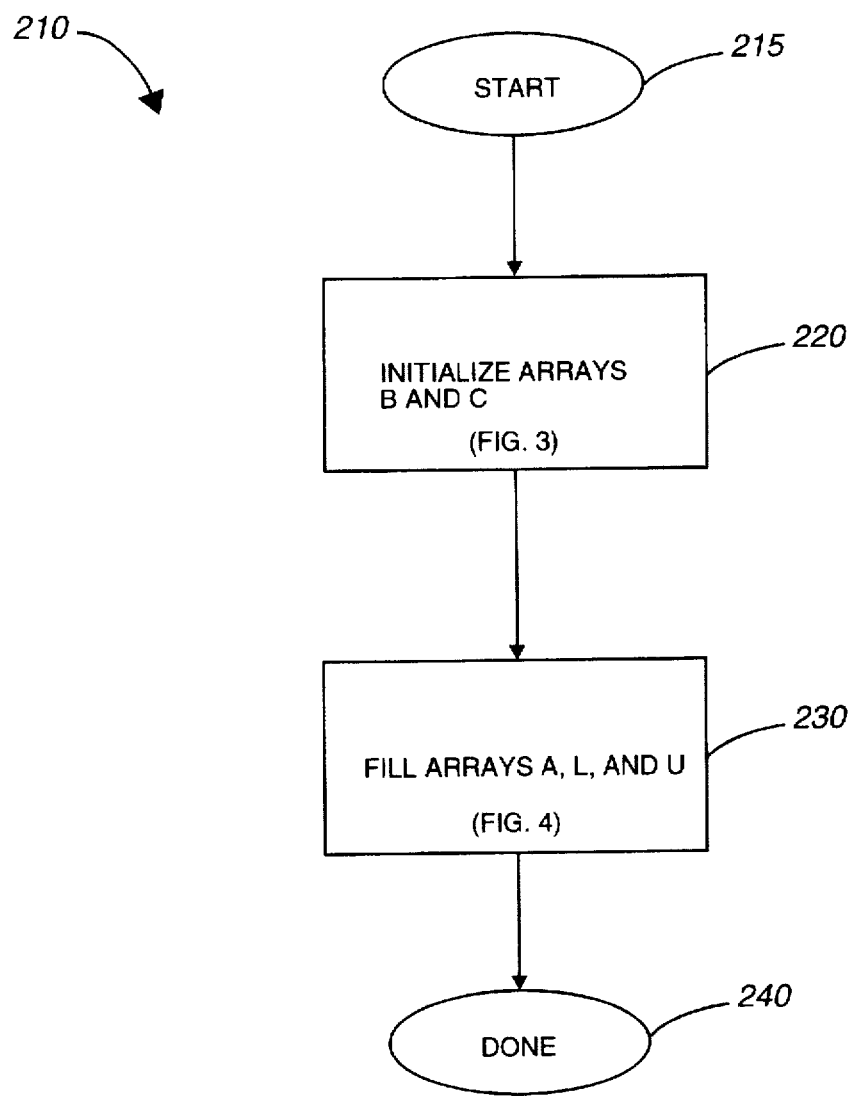
FIG. 2 is a flow diagram illustrating a method of generating data suitable for implementing a convolutional interleaving addressing scheme in accordance with one preferred embodiment of the present invention.

Referring next to FIGS. 2–8, a method of generating an initial value array, a lower limit array and an upper limit array for both the interleaver and the deinterleaver which require a minimal amount of memory will be described in detail. Referring initially to FIG. 2, the array generating process 210 for the interleaver begins with the initialization of delay related arrays in step 220. In this embodiment, there are two delay related arrays. In some embodiments, however, there may be more than two delay related arrays. The delay related arrays are respectively referred to herein as the B and C arrays. The actual steps that are taken to generate the delay related arrays will be described in more detail below with reference to FIG. 3. However, as an overview, the values in the B and C arrays are chosen such that:

$$D[i]=B[i]*N+C[i]$$

where N is the designated number of symbols per interleaved block and the array D, as previously described, is the array which holds the delays through the inteleaver.

After the delay related arrays have been generated, the logic moves to step 230 where the contents of the initial value array [A], the lower limit array [L], and the upper limit array [U] are generated. The actual steps that are taken to generate these arrays will be described in more detail below with reference to FIGS. 4–6. Once the initial value, lower limit and upper limit arrays have been generated, all of the numbers necessary to fully define a convolutional interleaving based addressing scheme that permits the use of nearly the theoretical minimal amount of memory are available.

Figure 3:
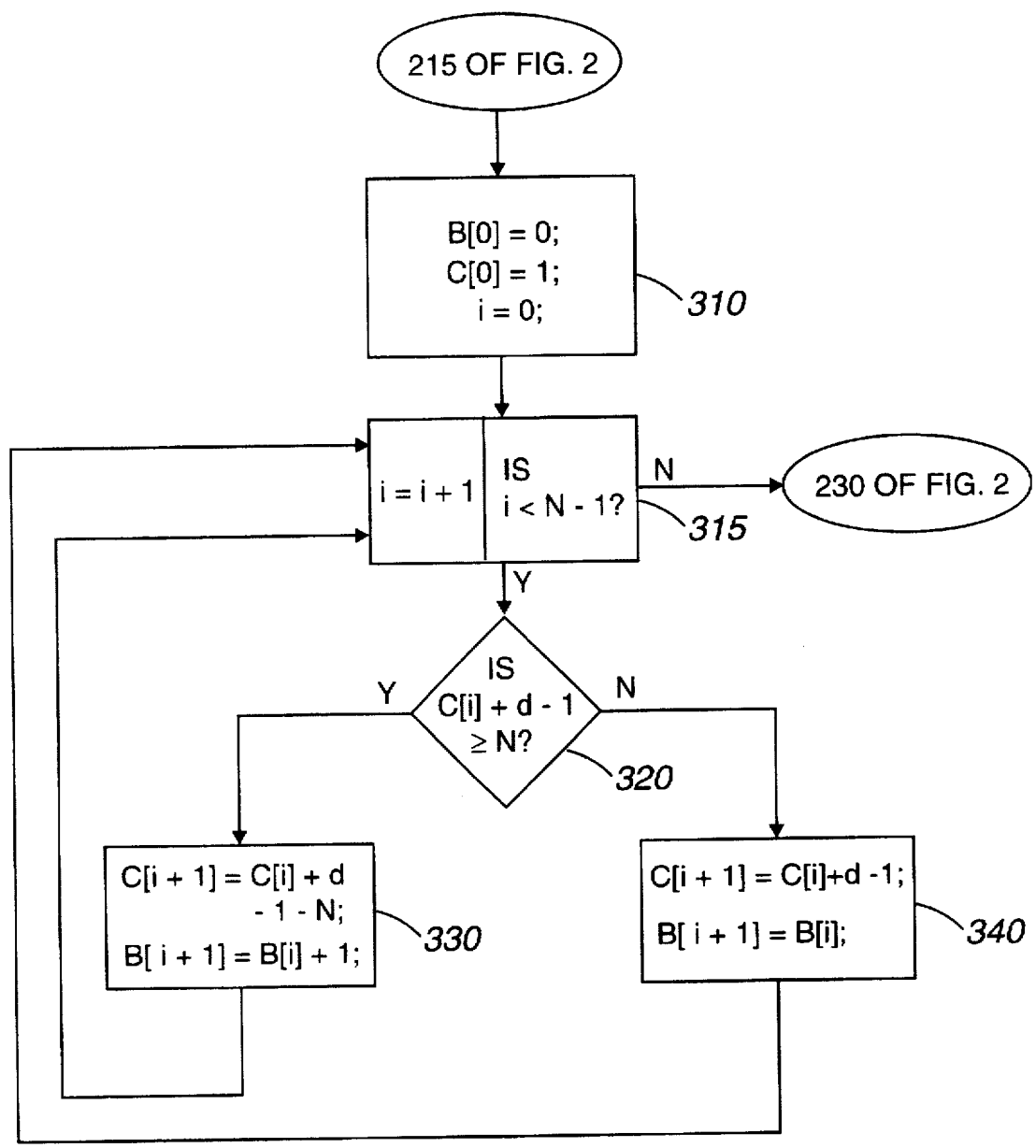
FIG. 3 is a flow diagram illustrating a method of filling a pair of delay related arrays (Step 220 of FIG. 2) in accordance with one preferred embodiment of the present invention. The delay related arrays are helpful in generating appropriate initial address, lower limit and upper limit arrays.

Referring next to FIG. 3, step 220 from FIG. 2, the step of initializing delay related arrays, will be described in more detail. As pointed out above, the delay related arrays are referred to as the B and C arrays. Initially, in step 310 a number of variables are initialized. The first element in the B array (element B[0]) is set equal to zero, while the first element in the C array (element C[0]) is set to one. A counter i is also initialized to zero. It should be appreciated that the element in position 0 in both the B and the C arrays corresponds to the first symbol in the block of data to be interleaved, $S_0$. The proper delay D[0] for element $S_0$ always has a value of one. Thus:

$$D[0]=B[0]*N+C[0]=0*N+1=1$$

After the initialization step, the logic proceeds to a loop (steps 315–340) that fills the remainder of the B and C arrays. Initially, in step 315, the counter i is re-initialized to zero. Then the logic proceeds to step 320 where it is determined whether the sum of the value of the previous entry in the C array plus the interleaving depth minus one is greater than or equal to N (i.e. is: C[i]+d–1>N). If so, the logic proceeds to step 330 where the values for C[i+1] and B[i+1] are set. If not, the logic proceeds to step 340 where the values for C[i+1] and B[i+1] are set using a different formula than the formula used in step 330. Specifically, in step 330 (which occurs when the determination in step 320 was affirmative) the values C[i+1] and B[i+1] are set such that:

$$C[i+1]=C[i]+d-1-N;$$

and $$B[i+1]=B[i]+1$$

On the other hand, when the determination in step 320 is negative, the values C[i+1] and B[i+1] are set such that:

$$C[i+1]=C[i]+d-1;$$

and $$B[i+1]=B[i]$$

After the values for C[i+1] and B[i+1] are set, the logic returns to step 315 where the counter i is incremented and the process is repeated until all of the symbols in the block of data are processed and have corresponding entries in the B and C arrays. In the embodiment shown, this is accomplished by comparing the value of counter i to N–1. As long as the value of i is less than N–1, the delay based arrays have not been filled. When counter i is equal to N–1, the arrays have been completely filled and the logic proceeds to step 230 of FIG. 2 where the initial value, lower limit, and upper limit arrays are filled.

Figure 4:
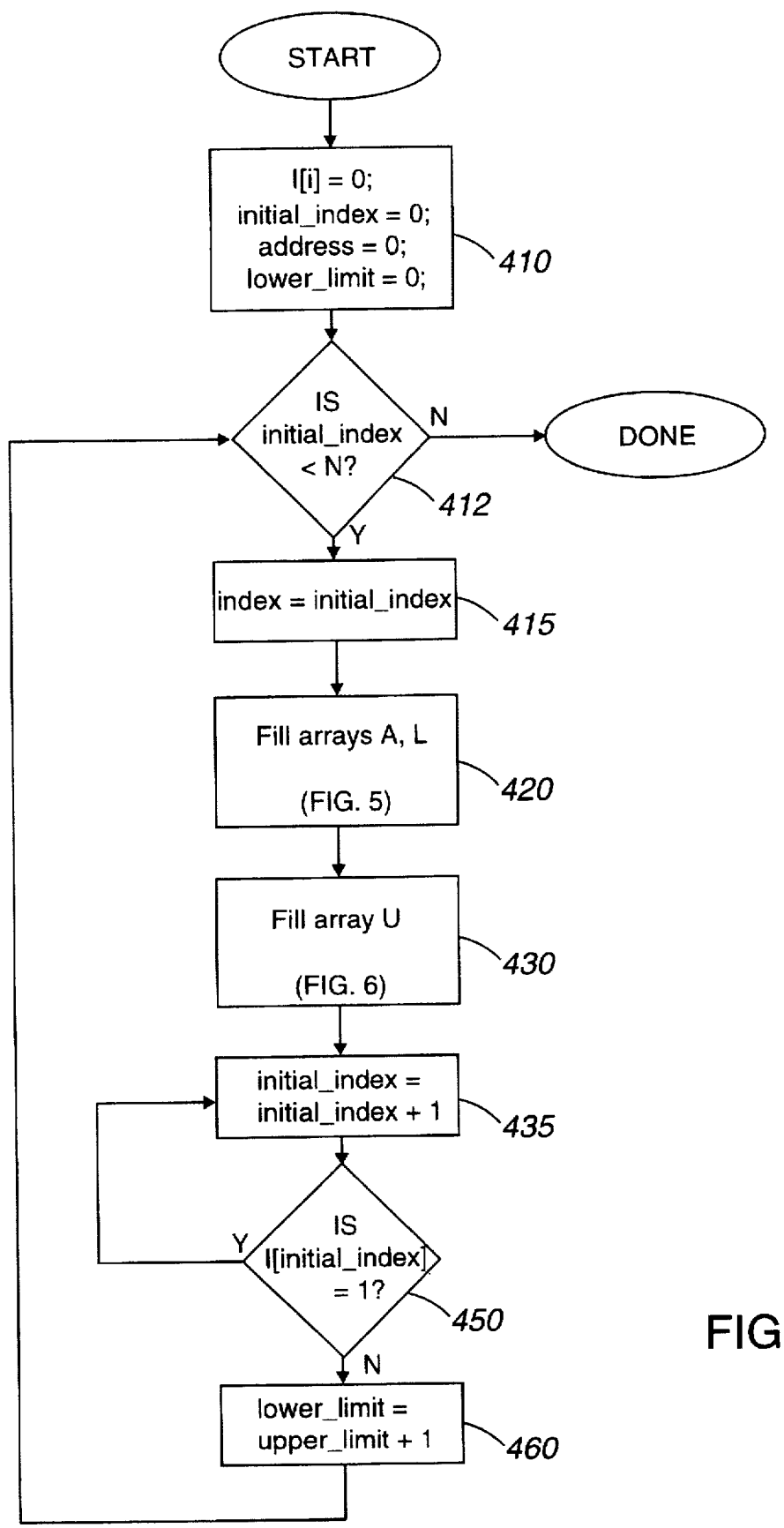
FIG. 4 is a flow diagram illustrating a method of filling an initial value array, an upper limit array and a lower limit array (Step 230 of FIG. 2) in accordance with one preferred embodiment of the present invention.
Figure 5:
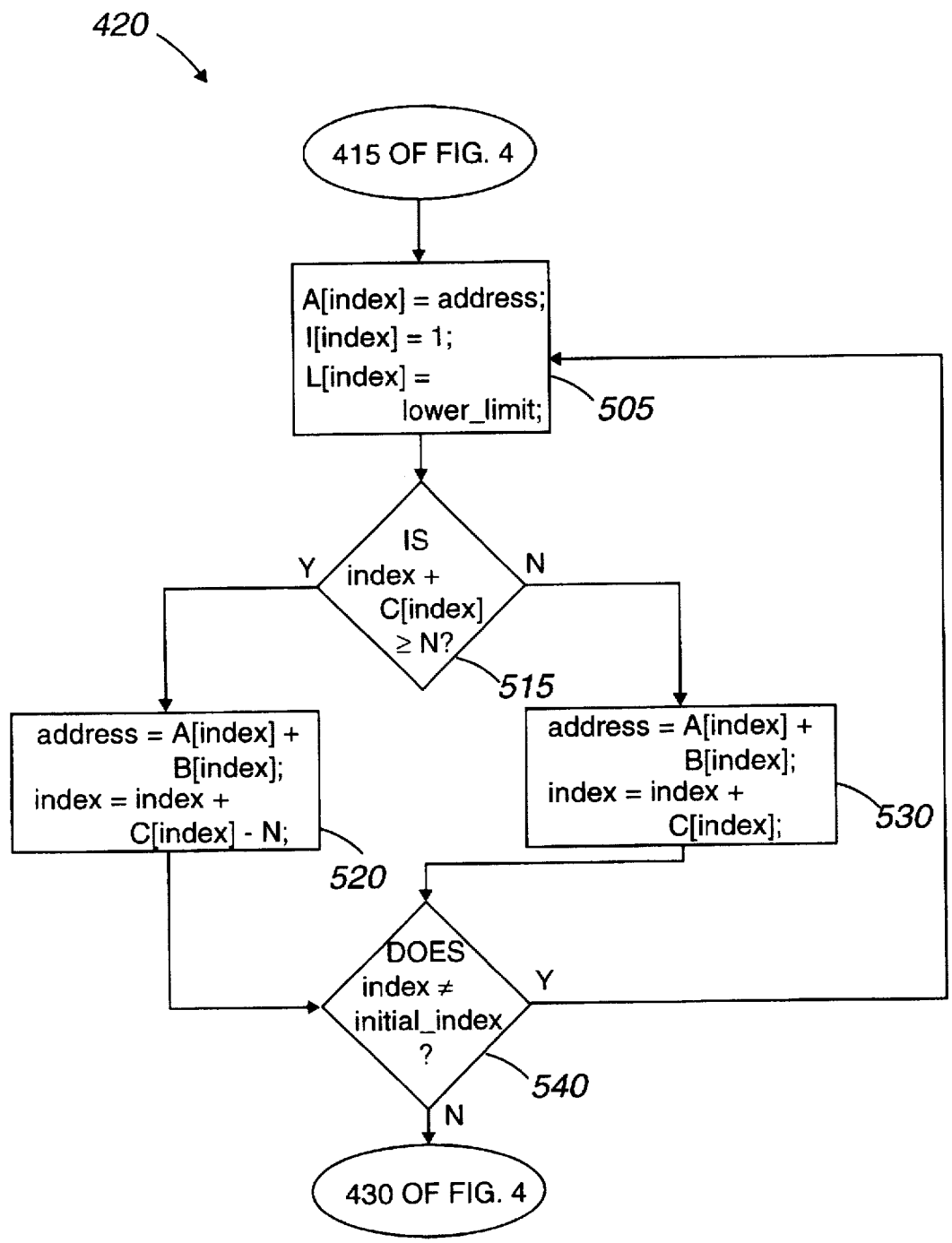
FIG. 5 is a flow chart illustrating a method of accomplishing step 420 of FIG. 4 (i.e. filling the initial value and lower limit arrays) in accordance with one preferred embodiment of the present invention.
Figure 6:
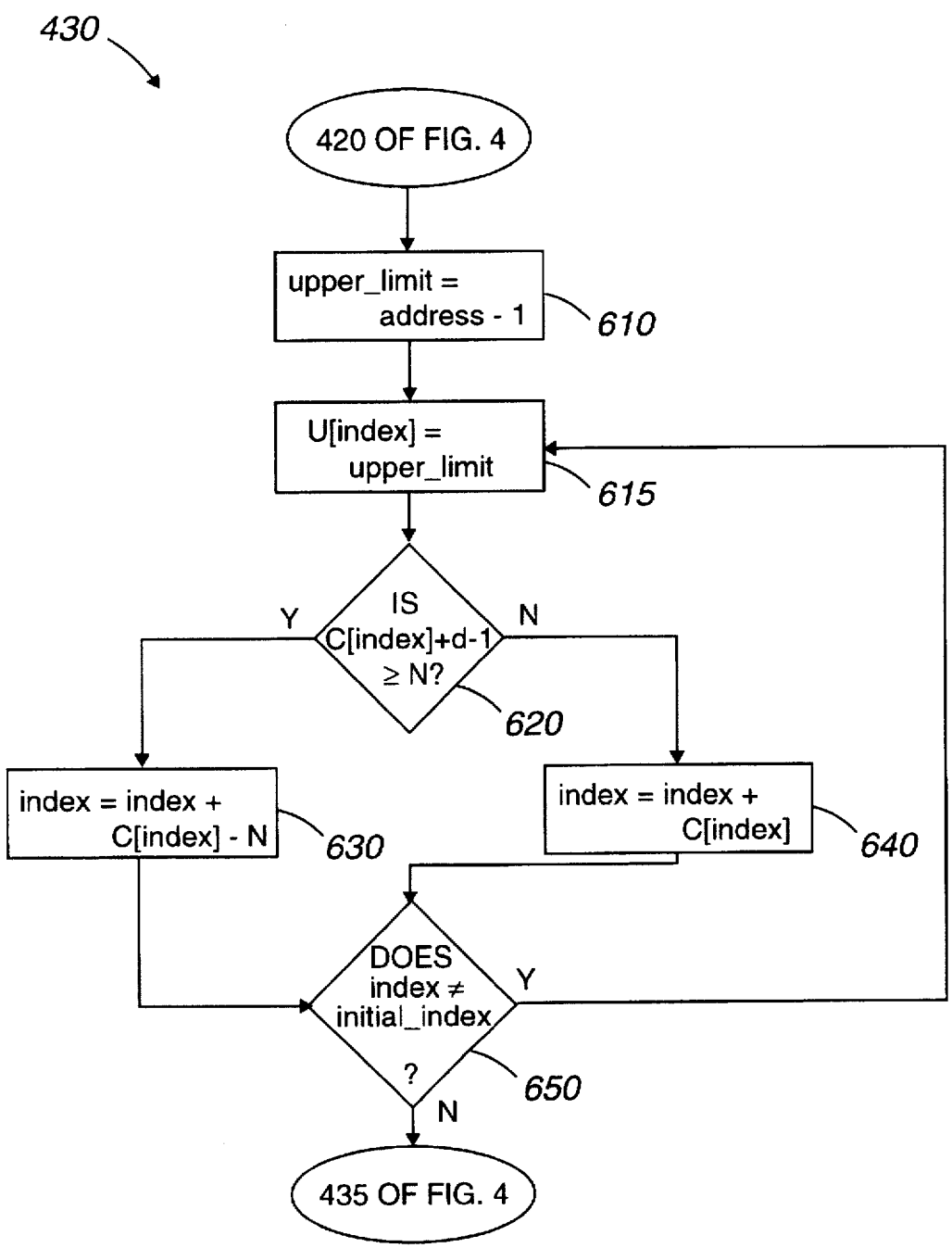
FIG. 6 is a flow chart illustrating a method of accomplishing step 430 of FIG. 4 (i.e. filling the upper limit array) in accordance with one preferred embodiment of the present invention.

Referring next to FIG. 4–6, a process suitable for filling the initial value, lower limit and upper limit arrays as described with respect to step 230 of FIG. 2 will be described in more detail. Referring initially to FIG. 4, a number of variables are initialized in step 410. Specifically, all of the elements of an array I, as well as variables initial_index, address, and lower_limit are all set equal to zero.

Thereafter, in step 412 a determination is made as to whether the value of initial_index is less than the number of symbols per block N. If so, the logic proceeds to step 415 where the value of variable index is set equal to the value in variable initial_index. This marks the beginning of processing for an orbit, or a pattern. Next, in step 420 the initial value array A and the lower limit array L are filled as will be described in more detail below with reference to FIG. 5.

After the initial value and lower limit arrays have been filled in step 420, the logic proceeds to step 430 where the upper limit array U is filled as will be described in more detail below with reference to FIG. 6. After all three arrays have been filled in steps 420 and 430, the value of the initial_index variable is incremented by one in step 435. Thereafter, in step 450, a determination is made as to whether the value stored in array I at the position corresponding to initial_index, i.e. I[initial_index], is equal to one. If so, the logic returns to step 435 where the initial_index variable is incremented by one and step 450 is repeated. It should be appreciated that this step checks to determine if the elements in the initial value array A, the lower limit array L, and the upper limit array U corresponding to the position specified by the initial_index variable have been filled. If I[initial index] is equal to one, then the elements in the initial value array A, the lower limit array L, and the upper limit array U have been filled; similarly, if I[initial_index] is equal to zero, then the elements in the arrays have not been filled. After the initial_index variable has been incremented in step 435, and it is determined in step 450 that the value of I[initial index] is not equal to one, the logic proceeds to step 460 where the lower_limit variable is set equal to the upper_limit variable plus one. The logic then returns to step 412 where it is determined whether the value stored in the initial_index variable is less than N. If so, the initial value, lower limit, and upper limit arrays for the next symbol are determined by repeating the aforementioned steps 415–450, and the processing of another orbit begins. When the initial value, upper limit and lower limit arrays have all been completely filled, the determination in step 412 will be that the variable initial_index is equal to the number of symbols N. At this point, the initial value, lower limit, and upper limit array filling step is completed.

Referring next to FIG. 5, the step of filling the initial value and lower limit arrays as depicted in step 420 of FIG. 4 will be described in more detail. Initially, the value in array I corresponding to the location specified by variable index, denoted as I[index], is set equal to one in step 505. The value of I[index] equal to one serves as an indication that the elements in the initial value array A and the lower limit array L corresponding to variable index are filled. The value in the initial value array A which corresponds to variable index, i.e. A[index], is set equal to the corresponding value of variable address, and the value in the lower limit array L in the position specified by variable index, denoted as L[index], is set equal to the value of variable lower_limit in step 505. Thereafter, in step 515, a determination is made as to whether the sum of variable index and C[index] is greater than or equal to N. That is, is the following relationship satisfied:

$$index+C[index] \geq N$$

If the result of step 515 is affirmative, the logic proceeds to step 520 where the variable address is set equal to A[index] plus B[index], and the variable index is set equal to index+C[index]–N. Alternatively, if the result of step 515 is negative, the logic proceeds to step 530 where the variable address is set equal to A[index]+B[index] and the variable index is set equal to the sum of index+C[index]. It should be appreciated that steps 520 and 530 both set the values of the variables address and index. The value to which the variable index is set depends upon the determination of whether or not the value of index+C[index] is greater than or equal to N in step 515. After the values of variables address and index have been properly set in either step 520 or 530, the logic proceeds to step 540 where it is determined whether or not the variable index is equal to the variable initial_index. If the two variables are equal, the initial value array A and the lower limit array L have been successfully filled for one orbit, and the logic moves to step 430 as illustrated in FIG. 4. Alternatively, if the variable index is not equal to the variable initial_index, the logic returns to step 505 where the value of the variables are reset as described above and steps 505–540 are repeated. When it is eventually determined in step 540 that the current value of variable index is equal to the current value of initial_index, an orbit is considered to be complete. The logic then proceeds to the upper limit array filling step 430.

Referring next to FIG. 6, the upper limit array filling step 430 of FIG. 4 will be described in more detail. Initially, the variable upper_limit is set equal to the variable address minus 1 in step 610. Thereafter, the value of the upper limit array U which corresponds to variable index, i.e. U[index], is set equal to the value of variable upper_limit in step 615. In step 620, a determination is made as to whether the value of the sum of variable index added to C[index] is greater than or equal to the number of symbols in a block of data N. If so, the logic proceeds to step 630 where the variable index is set equal to index+C[index]–N. Alternatively, if the determination in block 620 is negative, the variable index is set equal to the value of index+C[index] in step 640. Thus, it should be appreciated that steps 630 and 640 are merely alternative mechanisms by which the value of the variable index is set.

After the value of variable index has been set in either step 630 or 640, the logic proceeds to step 650 where the determination is made as to whether the value of variable index is equal to the value of variable initial_index. If it is determined that the value of variable index does not equal the value of variable initial_index, the logic returns to step 615 where U[index] is set equal to the value of variable upper_limit. Thereafter, steps 620–650 are repeated until it is determined in step 650 that the value of variable index does equal the value of variable initial_index, at which point all entries for the upper limit array U for a given orbit have been assigned. When such a determination is made, the upper limit array filling step 430 for one orbit is completed and the logic proceeds to step 435 as illustrated in FIG. 4.

The description set forth with reference to FIGS. 2–6 has described a method of generating the appropriate initial value, lower limit, and upper limit arrays for the interleaver. In order to deinterleave the interleaved system, a mirror image of the interleaving must be accomplished by the deinterleaver. This process will be described with reference to FIGS. 7 and 8. Much like the method described above with respect to the interleaver, values for the initial value, lower limit, and upper limit arrays, A, L, and U, respectively, must be determined. However, in the case of the deinterleaver, determining the appropriate values for the initial value, lower limit and upper limit arrays must be preceded by the determination of the values for inverse delay related arrays BI and CI. In terms of the deinterleaver, the inverse delay related arrays BI and CI represent the delay of the interleaver. The values for the inverse delay related arrays BI and CI are used to determine the values of the delay related arrays B and C. In this embodiment, there are two inverse delay related arrays and two delay related arrays. In other embodiments, there may be any number of inverse delay related arrays and delay related arrays. Here, in the context of the deinterleaver, delay related arrays B and C represent the delay of the deinterleaver. The values in the B and C arrays are set such that:

$$D[i]=B[i]*N+C[i]$$

As previously discussed, D[i] is the value of the delay associated with element i, and N is the designated number of symbols per interleaved block. The actual steps that are taken to generate the inverse delay related arrays BI and CI as well as arrays B and C will be described in more detail below with reference to FIG. 8.

Figure 7:
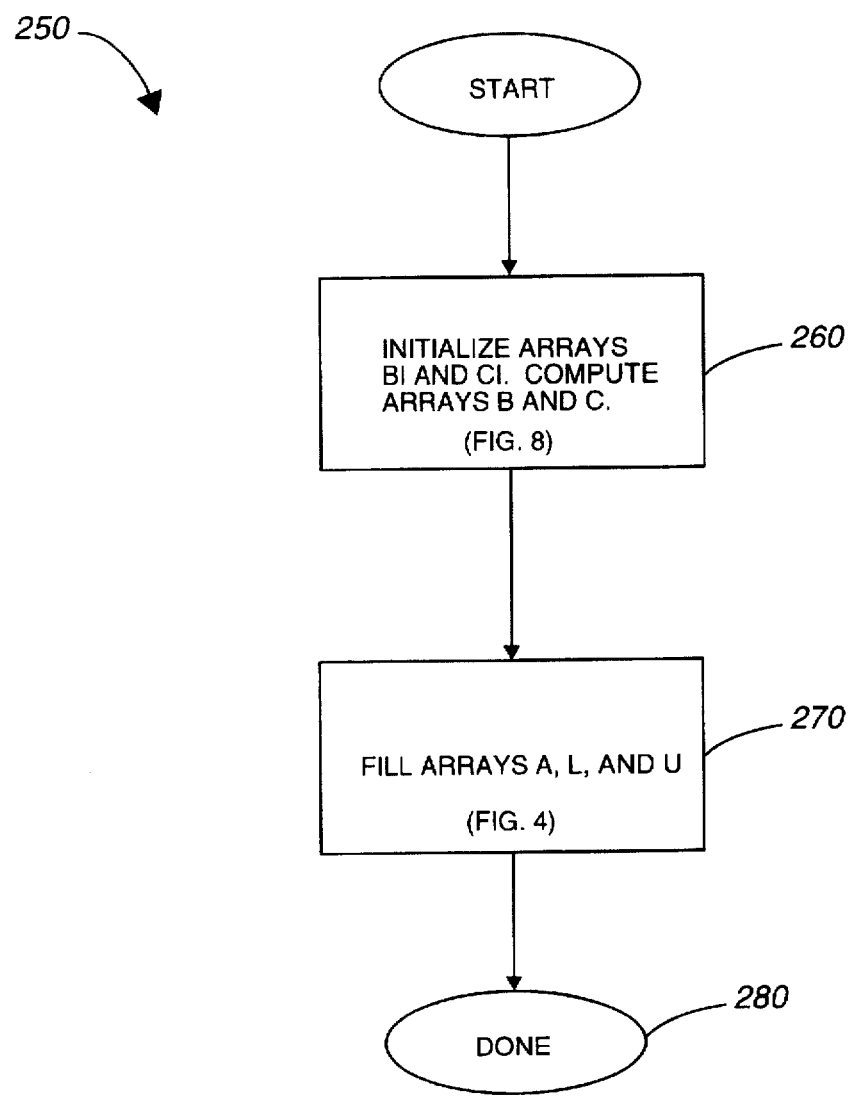
FIG. 7 is a flow diagram illustrating a method of generating data suitable for implementing a convolutional deinterleaving addressing scheme in accordance with one preferred embodiment of the present invention.

After the inverse delay related arrays have been generated, the logic moves to step 270 of FIG. 7 where the initial value, lower limit and upper limit arrays are filled in the manner previously described with respect to FIGS. 4–6. Once the initial value, lower limit and upper limit arrays have been generated, all of the numbers necessary to fully define a convolutional deinterleaver addressing scheme suitable for use with the above described interleaving addressing scheme are available. Like the interleaving based addressing scheme, the described deinterleaving addressing scheme permits the use of nearly the minimal amount of memory.

Figure 8:
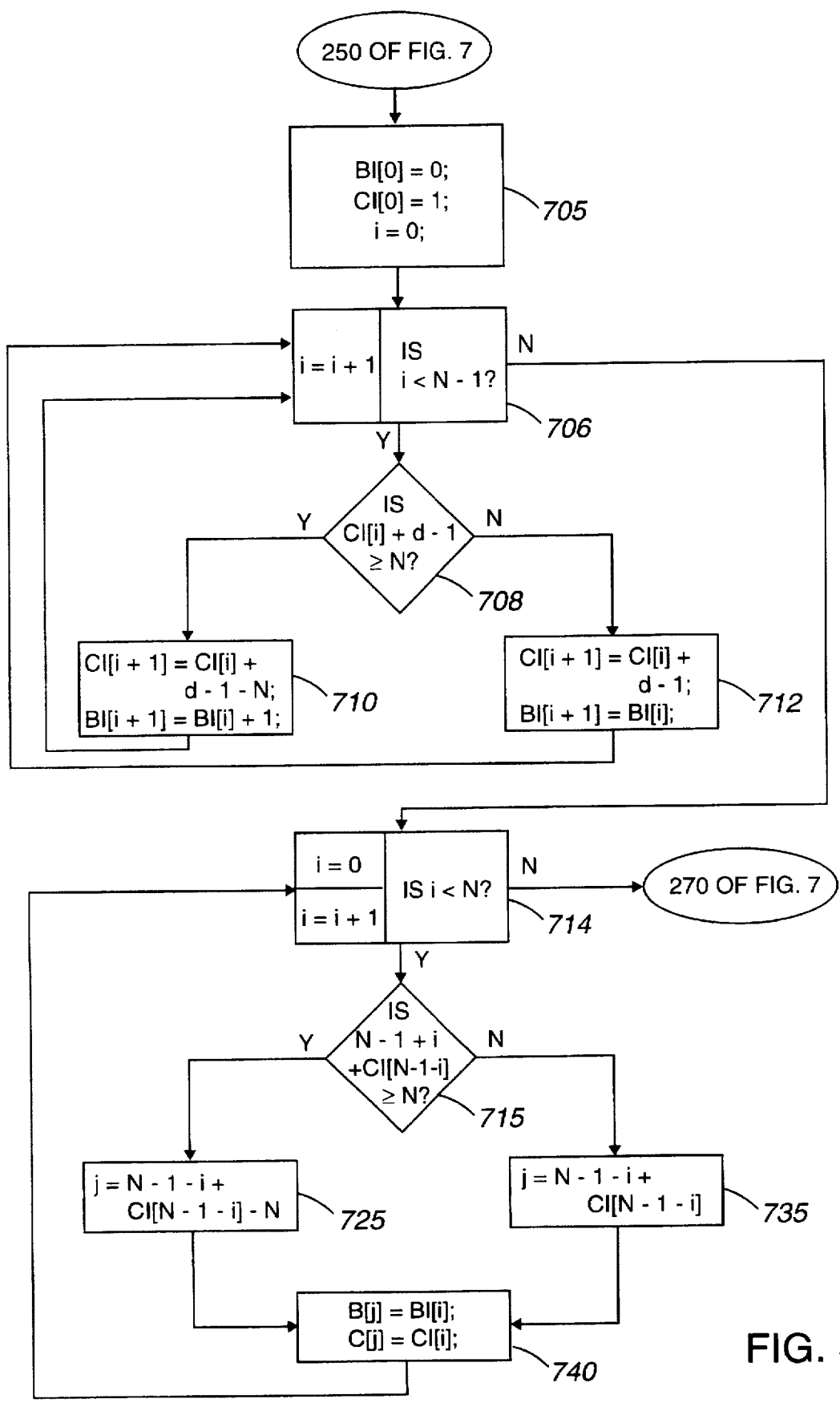
FIG. 8 is a flow diagram illustrating a method of filling a pair of delay related arrays (Step 260 of FIG. 7) in accordance with one preferred embodiment of the present invention. The delay related arrays are helpful in generating appropriate initial address, lower limit and upper limit arrays.

Referring next to FIG. 8, the initialization of the delay related arrays for the deinterleaver (step 260 from FIG. 7) will be described in more detail. The inverse delay related arrays for the deinterleaver are referred to herein as the BI and CI arrays. Arrays BI and CI are eventually related to the previously described delay related arrays B and C for the deinterleaver. Initially, in step 260, the first elements of the BI and CI arrays, that is, BI[0] and CI[0], are initialized, as is a counter i. BI[0] and the counter i are initialized to zero, whereas CI[0] is set to one.

After the initialization step, the logic proceeds to a loop (steps 706–712) which fills in the BI and CI arrays. The loop is repeated until every element of the BI and CI arrays is filled. Initially, in step 706, the counter i is reinitialized to zero. Then, the logic proceeds to step 708 where the determination is made as to whether the sum of the value of the CI array corresponding to position i plus the interleaving depth d minus one is greater than or equal to the word length N. That is, is does the following relationship hold:

$$CI[i]+d-1 \geq N$$

If the relationship holds, the logic proceeds to step 710 where the values for CI[i+1] and BI[i+1] are set. If the relationship does not hold, the logic proceeds to step 712 where the values for CI[i+1] and BI[i+1] are set using formulas which differ from those used in step 710. Specifically, in step 710, the values of CI[i+1] and BI[i+1] are set such that:

$$CI[i+1]=CI[i]+d-1-N;$$

and, $$BI[i+1]=BI[i]+1$$

In step 712, however, the values of CI[i+1] and BI[i+1] are set such that:

$$CI[i+1]=CI[i]+d-1;$$

and, $$BI[i+1]=BI[i]$$

After the values of CI[i+1] and BI[i+1] are set, the logic returns to step 708 where the counter i is incremented and steps 708–712 are repeated until the BI and CI arrays are full. In the embodiment shown, this is accomplished by comparing the counter i to the word length N minus one. As long as the counter i is less than the word length N minus one, arrays BI and CI have not been completely filled. When counter i is exactly equal to N minus 1, the arrays have been filled, and the logic proceeds to a loop which fills delay related arrays B and C (steps 714–740).

The loop in steps 714–740 is repeated until each element of the B and C arrays is filled. Initially, in step 714, the counter i is reinitialized to zero. Then, the logic proceeds to step 715 where it is determined whether the following relationship holds:

$$N-1+i+CI[N-1-i] \geq N$$

If the result of step 715 is affirmative, the logic proceeds to step 725 where a variable index j is set. If the result of step 715 is negative, the logic proceeds to step 735 where a variable index j is set using a different formula than the one used in step 725. Specifically, in step 725, the value of the variable index j is set such that:

$$j=N-1-i+CI[N-1]-N$$

On the other hand, in step 735, the value of the variable index j is set such that:

$$j=N-1-i+CI[N-1-i]$$

After the variable index j is set either in step 725 or step 735, the logic proceeds to step 740, where the elements corresponding to position j of arrays B and C are set. In step 740, B[j] is set to equal BI[i], and C[j] is set to equal CI[j]. The logic then returns to step 714, where the counter i is incremented and steps 714–740 are repeated until all of the elements in arrays B and C are filled. Until the counter i is greater than the word length N, arrays B and C have not been completely filled. As soon as counter i is greater than word length N, thereby signaling that arrays B and C have been filled, the logic proceeds to step 270 of FIG. 7, which, as previously described, sets the values of the initial value array A, the lower limit array L, and the upper limit array U. The specific steps required to set the values for arrays A, L, and U for the deinterleaver are the same as those required by the interleaver, and were described earlier with reference to FIGS. 4–6.

Figure 10:
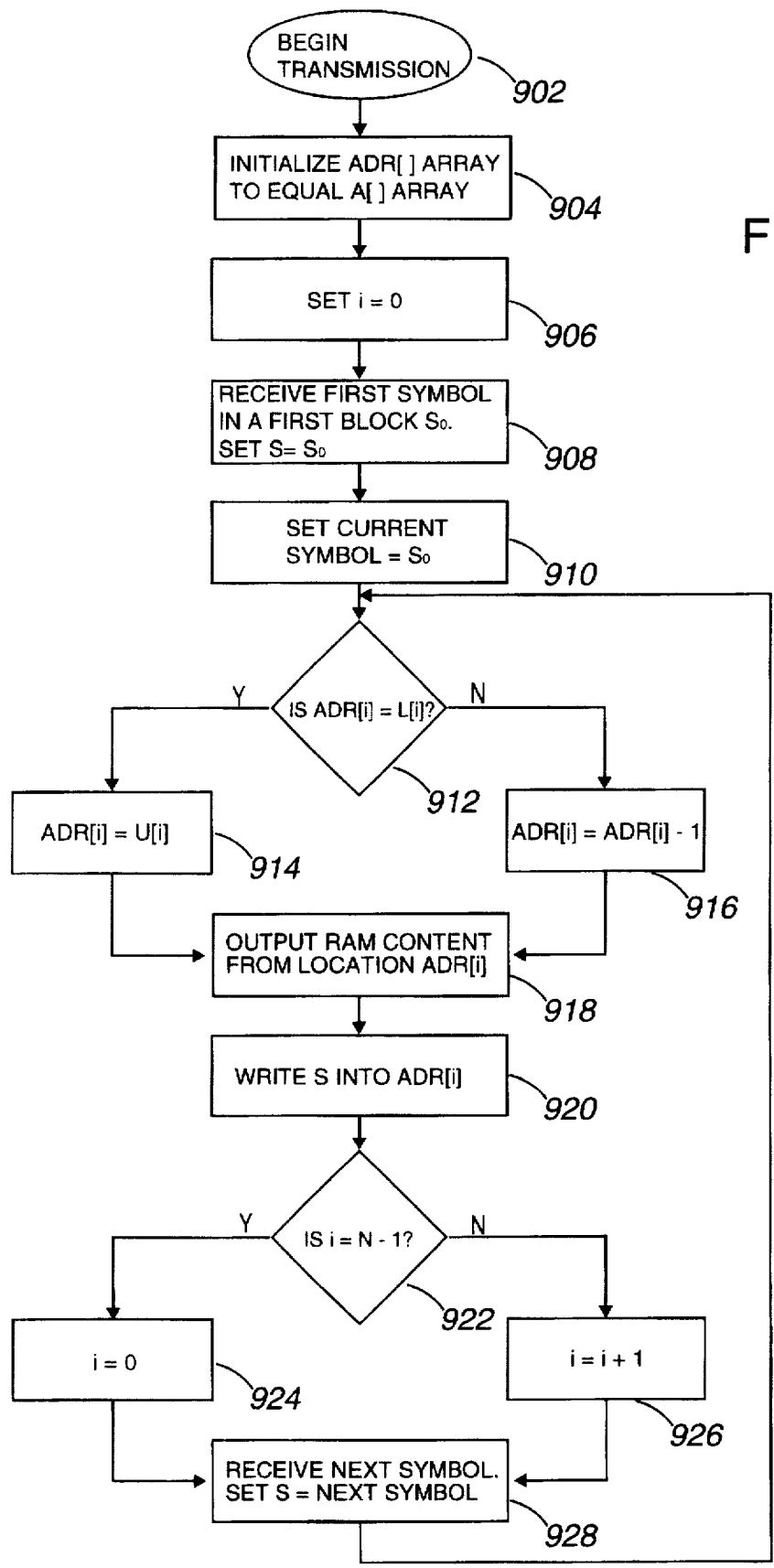
FIG. 10 is a flow diagram illustrating a method of transmitting data and generating an address sequence for the RAM in accordance with one preferred embodiment of the present invention.

Referring next to FIG. 10, the process of transmitting data will be described in detail. Transmission begins at step 902. The RAM address array ADR is initialized to equal the initial value array A in step 904. A counter i is then set to zero as shown in step 906. The first symbol $S_0$ is read in from the first block and variable S is set equal to $S_0$ in step 908. The value of the current symbol is set to equal $S_0$ in step 910. Thereafter, in step 912, a determination is made as to whether the value held in position i of the RAM address array ADR is equal to the corresponding value held in the lower limit array L. That is, is the following relationship true:

$$ADR[i]=L[i]$$

If the result of step 912 is affirmative, the logic proceeds to step 914 where the value held in position i of the RAM address array ADR is set equal to the value held in position i of the upper limit array U. Alternatively, if the result of step 912 is negative, the logic proceeds to step 916 where the value held in position i of the RAM address array is reset to equal the value held in position i of the RAM address array minus one. That is:

$$ADR[i]=ADR[i]-1$$

It should be appreciated that steps 914 and 916 both set values for the RAM address array ADR. The value to which position i of the RAM address array ADR is set is dependent upon the determination of whether address ADR[i] is equal to L[i]. This determination is made in step 912. After the value of address ADR[i] has been properly set in either step 914 or 916, the logic proceeds to step 918 where the content of the RAM corresponding to the location specified by the address ADR[i] is output. Then, the value held in variable S is written into position i of the RAM address array ADR in step 920. Thereafter, in step 922, a determination is made as to whether the counter i is equal to the designated number of symbols per interleaved block N minus one. That is, is the following statement satisfied:

$$i=N-1$$

If the result of step 922 is affirmative, the logic proceeds to step 924 where the counter i is set equal to zero. Alternatively, if the result of step 922 is negative, the logic proceeds to step 926 where the counter i is incremented by one. It should be appreciated that steps 924 and 926 both set values for the counter i. The value to which counter i is set is dependent upon the determination of whether counter i is equal to N−1 in step 922. After the value of counter i has been properly set in either step 924 or 926, the logic proceeds to step 928 where the next symbol is received, and variable S is set equal to the next symbol. The logic then returns to step 912, and steps 912–928 are repeated.

ILLUSTRATIVE EXAMPLE

The method for interleaving and deinterleaving data as described above will be applied to an illustrative example. In the example, the interleaver input symbols are separated into words of length N, where N is equal to thirteen. The interleaving depth d is five.

With reference to FIG. 2, the first step in the interleaving process is to generate the delay related arrays B and C, as described in step 220. The actual generation of delay related arrays B and C is shown in FIG. 3. For N=13 and d=5, the values generated for delay related array B are:

$$B=[0\ 0\ 0\ 1\ 1\ 1\ 1\ 2\ 2\ 2\ 3\ 3\ 3]$$

The values generated for delay related array C are:

$$C=[1\ 5\ 9\ 0\ 4\ 8\ 12\ 3\ 7\ 11\ 2\ 6\ 10]$$

The delay array D, which holds the overall delays for the symbols, may be calculated as follows:

$$D[i]=B[i]*N+C[i]$$

D[i] represents the delay of symbol i, while B[i] and C[i] are the values held in position i of arrays B and C, respectively. B[i] may be understood to represent the number of rows to pass over before another occurrence of the value of the address corresponding to symbol i recurs. C[i] may be understood to represent the number of columns to pass over before another occurrence of the value of the address corresponding to symbol i occurs. Given the values in the delay related arrays B and C as generated using the steps shown in FIG. 3, the delay array D is as follows:

$$D=[1\ 5\ 9\ 13\ 17\ 21\ 25\ 29\ 33\ 37\ 41\ 45\ 49]$$

D[i] represents the total number of address locations to pass over before another occurrence of the value of the address corresponding to symbol i occurs.

Figure 11:
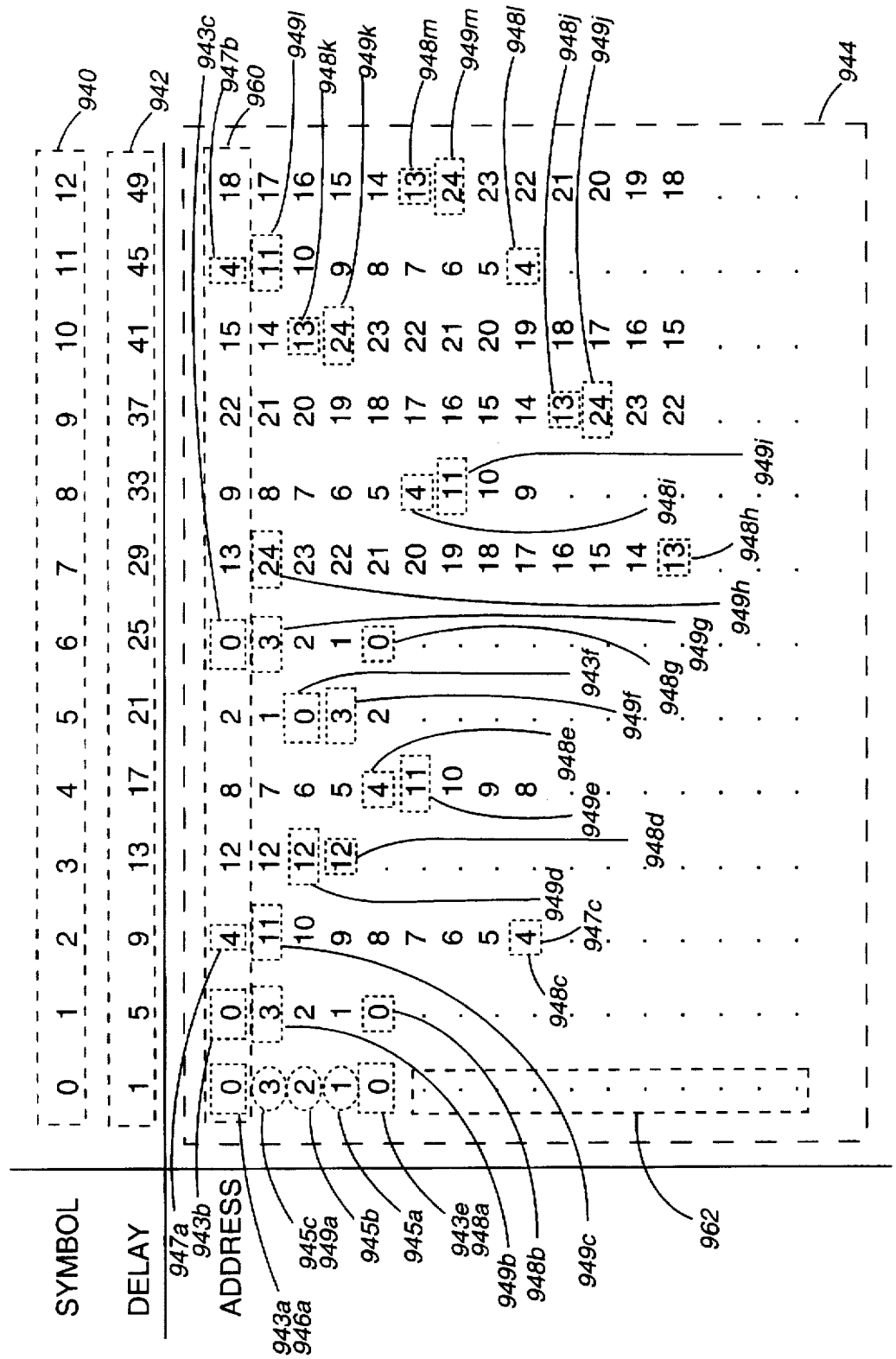
FIG. 11 is a chart representing the address generated by interleaving a data set with N=13 and d=5 in accordance with one preferred embodiment of the present invention.

FIG. 11 is a chart which represents the address generated by interleaving a data set with N=13 and d=5. The first row 940 of the chart represents the place holders for the symbols which make a word length N which is thirteen symbols long. The second row 942 of the chart represents the delay array D as generated from the delay related arrays B and C. The remaining rows represent the address sequence 944 in the form of a two-dimensional address array. The columns of the two-dimensional address array represent a sub-sequence, decimated by N, of the address sequence 944. Using this terminology, the initial value array A described above is the first address in the address sub-sequence, the lower limit array L represents the lower limits for the sub-sequences, and the upper limit array U represents the upper limits for the sub-sequences.

The A, L, and U arrays are filled using the process previously described with respect to FIG. 4. Step 410 initializes all variables necessary for the process of filling the A, L, and U arrays. In this embodiment, the first address value is zero. Accordingly, the first element 946a in the address array 944 is zero. The variable initial_index is initialized to zero. Step 412 is the determination of whether variable initial_index is less than word length N. In this case, variable initial_index is zero, and word length N is thirteen, so the result of step 412 is affirmative. Accordingly, the logic proceeds to step 415 in which variable index is set to the value of variable initial_index, which is zero. Next, the logic proceeds to step 420, the step of filling in arrays A and L, which was previously described in detail with respect to FIG. 5.

Referring to FIG. 5, several array elements are initialized in step 505. Most notably, the element in position index of array A is initialized to the value of variable address, which was set to zero in step 410 of FIG. 4. The logic proceeds to step 515, which is the determination of whether the value of variable index+C[index] is greater than or equal to the value of N. In this case, the value of index is zero and the element in position index of delay related array C has a value of one as shown above. Therefore, the result of step 515 is negative, so the logic proceeds to step 530, where the values of variables address and index are updated. Variable address is set to equal A[index] +B[index]. With variable index equal to zero, and A[0] and B[0] both equal to zero as described above, the new value of variable address is zero. Variable index is set equal to index+C[index]. With variable index equal to zero, and the value of C[0] equal to one, the updated value of variable index is equal to one. The logic then proceeds to step 540, which is the determination of whether the value of variable index is equal to the value of variable initial_index. In this case, the values of variables index and initial_index are not equal, so the logic returns to step 505. With variable index equal to one, the value of A[1] is set to the value of variable address, which has a value of zero. L[1] is set to the value of variable lower_limit which has a value of zero. The logic then proceeds through the loop of steps 505 through 540 until the value of variable index is equal to the value of variable initial_index, at which point the logic proceeds to step 430 of FIG. 4, the step in which the upper limit array U is filled.

Referring to FIG. 6, the process of filling the upper limit array U begins at step 610 where the variable upper_limit is initialized to a value of one less than the value of variable address. Currently, with the value of variable address equal to zero, the value of upper_limit is negative one. The element of upper limit array U corresponding to position index is set equal to the value of upper_limit in step 615. Step 620 us the determination of whether one subtracted from the sum of C[index] plus interleaving depth d is greater than or equal to the word length N. In this case, the result is negative, and the value of variable index is set equal to the sum of the value of variable index added to C[index]. With the existing value of variable index equal to one and the value of C[1] equal to five, the updated value of variable index is equal to six. The logic proceeds to step 650 where variable index is compared to variable initial_index. As the two are not equal, the logic returns to step 615, and steps 615 through 650 are repeated until variable index is equal to variable initial_index, in which case the logic proceeds to step 435 of FIG. 4, where variable initial_index is incremented by one.

The logic proceeds from step 435 of FIG. 4 to step 450, in which the determination is made as to whether the element located in the position identified by variable initial_index of array I is equal to one. Recall that array I is set in the process of filling arrays A and L as shown in FIG. 5. The value of variable initial_index is continually incremented until the determination in step 450 is false, in which case the value of variable lower_limit is set to equal the value of variable upper_limit incremented by one. The logic then proceeds back to step 412, and steps 412 through 460 are repeated until the determination in step 412, as previously discussed, is negative. If the determination is negative, the interleaving is completed.

In this embodiment, as previously discussed, the first element 943a in the address array is zero. The delay associated with the first element is the delay associated with column one, or symbol zero, is D[0], which has a value of one. Accordingly, the next occurrence of address value zero is one column away from the first occurrence. Hence, the first element in column two is the second occurrence 943b of address value zero. The delay associated with column two, i.e. D[1], is equal to five. This indicates that the next, in this case third, occurrence 943c of address value zero is five columns from the current, in this case second, occurrence of address value zero. The delay associated with column seven, i.e. D[6], is twenty-five, indicating that the next occurrence of the address value of zero will be associated with symbol five. Recall that the B array indicates the number of rows to skip and array C indicates the number of columns to skip before placing an address value associated with a given delay. In other words, D[6] is twenty-five, indicating that the number of rows to pass over B[6] is one, and the number of columns to pass over C[6] is twelve. Hence, the fourth occurrence 943d of address value zero is found in the third row of column six. The delay associated with column six, D[5], is twenty-one, and the associated values for B[5] and C[5] are one and eight, respectively. Therefore, the fifth occurrence 943e of address value zero is found in the fifth row of the first column of address array 944.

Since there are two occurrences of the address value of zero in column one, namely occurrences 943a and 943e, it is said that an orbit, in this case a first orbit, has been completed. The pattern of the address value of zero is repeated at infinitum. The spaces in the columns which contain the address value of zero, i.e. columns 1, 2, 5, and 6, are filled with the next available address values. In this case, there are three spaces between occurences of the address value of zero, so the next three available numbers are one, two, and three. The numbers one, two, and three are respectively referred to as 945a, 945b, and 945c, and are filled into the spaces in the columns. In this embodiment, numbers 945a, 945b, and 945c are the next three sequential numbers up from the number zero, and are filled into the spaces in the columns in descending order. However, numbers 945a, 945b, and 945c may be any numbers which are as yet unused in address array 944.

The next available address value is four, and the next available space in the first row 960 of address array 944 is in column three. Hence, a first occurrence of address value four (947a) is placed accordingly. The delay associated with this location is D[2], which has a value of nine. Thus, the next, or second, occurrence of address value four (947b) is placed nine columns over from column three. In turn, the next, or third, occurrence of address value four (947c) is placed forty-five columns over from column twelve. Given that there are now two occurrences, 947a and 947c, of address value four in a single column, the orbit associated with the address value of four is complete. Spaces in the orbit, in this case the second orbit, are filled with the next available address values. The remainder of address array 944 may be filled using the same method as discussed with reference to the first and second orbits.

Address array 944 for the interleaver is filled, through following the method discussed above, as shown in FIG. 11. The "dots" 962 indicate that the pattern of numbers in a column, or sub-sequence, is repeated. The first row 960 of the address array 944 is the initial value array A. The lowest values 948 in each sub-sequence correspond to the values stored in the lower limit array L, and the highest values 949 in each column correspond to the values stored in the upper limit array U. As such, the lower limit array L is as follows:

L=[0 0 4 12 4 0 0 13 4 13 13 4 13]

The upper limit array U is:

U=[3 3 11 12 11 3 3 24 11 24 24 11 24]

Four distinct orbits may be identified from the address array 944. A first orbit may be identified as consisting of symbols 0, 1, 5, and 6, with delays of 1, 5, 21, and 25. A second orbit consists of symbols 2, 4, 8, and 11, with delays of 9, 17, 33, and 45. A third orbit consists of symbol 3 with a delay of 13. A fourth orbit consists of symbols 7, 9, 10, and 12 with delays of 29, 37, 41, and 49.

Four memory locations are used to implement the delay values associated with the first orbit. That is, the sum of delays 1, 5, 21, and 25, divided by the word length N is equal to four. Similarly, eight memory locations are used to implement delay values associated with the second orbit, while only one memory location is necessary to implement the delay value for the third orbit, and twelve memory locations are used to implement the delay values associated with the fourth orbit. The total amount of memory required for the interleaver is twenty-five memory locations.

With reference to FIG. 7, the first step in the deinterleaving process is to generate the inverse delay related arrays BI and CI, as described in step 260. The generation of delay related arrays B and C from inverse delay related arrays BI and CI was previously described with reference to FIG. 8. For N=13 and d=5, the values generated for delay related array B are:

B=[2 3 1 2 0 1 3 1 2 0 1 3 0]

The values generated for delay related array C are:

C=[3 10 4 11 5 12 6 0 7 1 8 2 9]

The delay array D, which holds the overall delays for the symbols, may be calculated as follows:

$D[i]=B[i]*N+C[i]$

D[i] represents the delay of symbol i, while B[i] and C[i] are the values held in position i of arrays B and C, respectively. Given the values in the delay related arrays B and C as generated using the steps shown in FIG. 3, the delay array D is as follows:

D=[29 49 17 37 5 25 45 13 33 1 21 41 9]

Figure 12:
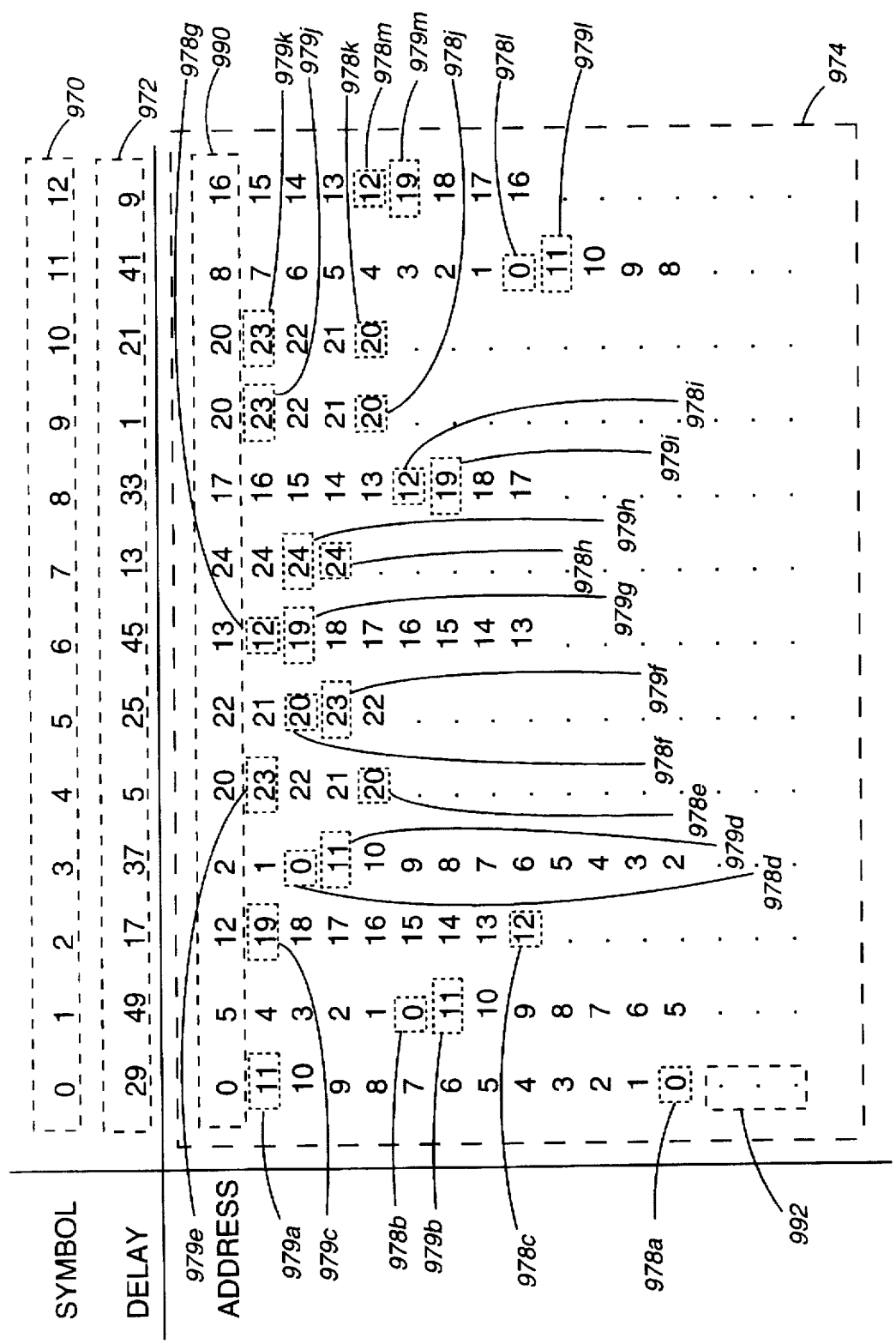
FIG. 12 is a chart representing the address generated by deinterleaving a data set with N=13 and d=5 in accordance with one preferred embodiment of the present invention.

FIG. 12 is a chart which represents the address generated by deinterleaving a data set with N=13 and d=5. The first row 970 of the chart represents the place holders for the symbols which make a word length N which is thirteen symbols long. The second row 972 of the chart represents the delay array D as generated from the delay related arrays B and C. The remaining rows represent the address array, or sequence, 974 in the form of a two-dimensional address array. The columns of the two-dimensional address array represent sub-sequences of the address sequence 974. The number of sub-sequences is equal to the number of symbols N. Using this terminology, the initial value array A described above is the first address in the address sequence, the lower limit array L represents the lower limits for the sub-sequences, and the upper limit array U represents the upper limits for the sub-sequences.

The address array 974 for the deinterleaver, when filled using the method discussed above with respect to FIGS. 4 through 8 and FIG. 11, is shown in FIG. 12. The "dots" 992 indicate that the pattern of numbers in a column, or sub-sequence, is repeated. The first row 990 of the address array 974 is the initial value array A. The lowest values 978 in each sub-sequence correspond to the values stored in the lower limit array L, and the highest values 979 in each column correspond to the values stored in the upper limit array U.

For the deinterleaver with N=13 and d=5, the lower limit array L is as follows:

L=[0 0 12 0 20 20 12 24 12 20 20 0 12]

The upper limit array U is:

U=[11 11 19 11 23 23 19 24 19 23 23 11 19]

Four distinct orbits may be identified from the address array 974. A first orbit may be identified as consisting of symbols 0, 1, 3, and 11, with delays of 29, 49, 37, and 41, respectively. A second orbit consists of symbols 2, 6, 8, and 12, with delays of 17, 45, 33, and 9, respectively. A third orbit consists of symbols 4, 5, 9, and 10 with delays of 5, 25, 1, and 21, respectively. A fourth orbit consists of symbol 7 with a delay of 13.

Twelve memory locations are necessary to implement the delay values associated with the first orbit. That is, the sum of delays 29, 49, 37, and 41, divided by the word length N is equal to twelve. Similarly, eight memory locations are used to implement delay values associated with the second orbit, four memory locations are necessary to implement the delay values for the third orbit, and one memory location is used to implement the delay value associated with the fourth orbit. The total amount of memory required for the deinterleaver is, therefore, twenty-five memory locations, the same amount as required by the interleaver for N=13 and d=5. Hence, the total number of memory elements, or RAM, necessary to implement the interleaver and the deinterleaver may be expressed as $(N-1)*(d-1)/2+1$.

Although only one embodiment of the present invention has been described, it should be understood that the present invention may be embodied in many other specific forms without departing from the spirit or scope of the invention.

The interleaving scheme is independent of the encoding and/or modulation schemes used in any particular communications system. One particular application is in conduction with multi-carrier transmission schemes such as discrete multi-tone (DMT) modulation. Such a modulation scheme has been adoped as a standard for the transmission of digital data over Asymmetric Digital Subscriber Lines (ADSL). The ADSL standard is intended primarily for transmitting video data over ordinary telephone lines, although it may be used in a variety of other applications as well. The discrete multi-tone transmission scheme is being considered for a wide variety of other applications as well. However, as described above, the convolutional interleaving technique described herein is applicable in conjunction with any encoding and/or modulation scheme. Therefore, the present examples are to be considered as illustrative and not restrictive, and the invention is not to be limited to the details given herein, but may be modified within the scope of the appended claims.

What is claimed is:

1. A method of convolutionally interleaving a stream of data, the convolutional interleaving being accomplished at a designated interleaving depth (d) and a designated interleaving block length (N), wherein a first symbol in a designated block has a predetermined delay associated therewith and each subsequent symbol in the designated block has a delay equal to (d−1) more than its predecessor symbol, the method comprising the steps of:

calculating a plurality of delay related arrays each including a number of elements equal to the designated block length, wherein the delay related arrays cooperate with the designated block length to define the delay associated with each symbol in the designated block;

calculating an initial value array, a lower limit array and an upper limit array based upon the delay related arrays, wherein each symbol in the designated block has an associated interleaving orbit defined by corresponding values in the initial value, lower limit and upper limit arrays; and generating a convolutional interleaving addressing scheme utilizing the initial value, lower limit and upper limit arrays.

2. A method as recited in claim 1 wherein an address at which each symbol in a first block of data is written into memory is defined in the initial value array.

3. A method as recited in claim 2 wherein the address at which each symbol in a subsequent block of data is written into memory is defined by:

(a) determining whether an address for a corresponding element in an immediately preceeding block is equal to the corresponding value in the lower limit array;

(b) setting the address of the element in the subsequent block of data to the corresponding value in the upper limit array when it is determined that the address for the corresponding element in the previous block is equal to the corresponding value of the lower limit array;

(c) setting the address of the element in the subsequent block of data to a value that is indexed from the address of the corresponding element in the previous block by a designated index amount when it is determined that the address of the corresponding element in the previous block is not equal to the corresponding value in the lower limit array; and (d) repeating steps (a)–(c) for additional subsequent blocks of data.

4. A method as recited in claim 3 wherein the designated index amount is a decrement by one.

5. A method as recited in claim 3 wherein the designated index amount is an increment by one.

6. A method as recited in claim 1 wherein the predetermined delay associated with the first symbol in the designated block is one.

7. A method as recited in claim 1 wherein the plurality of delay related arrays includes a first delay related array and a second delay related array.

8. A method as recited in claim 7 wherein the first delay related array (B) and the second delay related array (C) are calculated using the substeps of:

setting a first element $B[0]$ in the first delay related array equal to zero;

setting a first element $C[0]$ in the second delay related array equal to one; and, iterating through the first and second delay related arrays to sequentially set values for the remainder of the elements in the first and second delay related arrays, wherein when it is determined that a value equivalent to $C[i]+d-1>N$, then the values of the next elements in the first and second delay related arrays are effectively set according to the formulas:

$$C[i+1]=C[i]+d-1-N$$

$$B[i+1]=B[i]+1$$

and wherein when it is determined that the value equivalent to $C[i]+d-1<N$, then the values of the next elements in the first and second delay related arrays are effectively set according to the formulas:

$$C[i+1]=C[i]+d-1$$

$$B[i+1]=B[i].$$

9. A method as recited in claim 1 further comprising the steps of:

determining the elements in the upper limit, lower limit and initial value arrays corresponding to a first one of elements in the block, wherein the difference between the values in the upper limit and lower limit arrays corresponding to the first element in the block define a first orbit;

determining whether any other elements in the block share the first orbit and setting the upper limit, lower limit and initial value arrays corresponding to each additional element in the block that is determined to share the first orbit, wherein each element in the block that is determined to share the first orbit have identical values stored in a corresponding position in the upper limit array and identical values stored in a corresponding position in the lower limit array.

10. A method as recited in claim 9 further comprising determining whether any additional elements in the upper limit, lower limit and initial value arrays need to be filled in and when it is determined that additional elements in the upper limit, lower limit and initial value arrays need to be filled in, the method further comprises the steps of:

(a) determining the elements in the upper limit, lower limit and initial value arrays corresponding to a selected unprocessed one of the elements in the block, wherein the difference between the values in the upper limit and lower limit arrays corresponding to the selected unprocessed element in the block defines an additional orbit;

(b) determining whether any other elements in the block share the additional orbit and setting the upper limit, lower limit and initial value arrays corresponding to each additional element in the block that is determined to share the additional orbit, wherein each element in the block that is determined to share the additional orbit has identical values stored in the corresponding position in the upper limit array and identical values stored in the corresponding position in the lower limit array; and, repeating steps (a) and (b) until all of the elements in the block are processed.

11. A method of convolutionally deinterleaving a stream of data, the convolutional interleaving being accomplished at a designated interleaving depth (d) and a designated interleaving block length (N), wherein a first symbol in a designated block has a predetermined delay associated therewith and each subsequent symbol in the designated block has a delay equal to (d−1) more than its predecessor symbol, the method comprising the steps of:

calculating a plurality of delay related arrays each including a number of elements equal to the designated block length, wherein the delay related arrays cooperate with the designated block length to define the delay associated with each symbol in the designated block;

calculating an initial value array, a lower limit array and an upper limit array based upon the delay related arrays, wherein each symbol in a designated block has an associated interleaving orbit defined by corresponding values in the initial value, lower limit and upper limit arrays; and generating a convolutional deinterleaving addressing scheme utilizing the initial value, lower limit and upper limit arrays.

12. A method as recited in claim 11 wherein an address at which each symbol in a first block of data is written into memory is defined in the initial value array.

13. A method as recited in claim 12 wherein the address at which each symbol in a subsequent block of data is written into memory is defined by:

(a) determining whether an address for a corresponding element in an immediately preceeding block is equal to the corresponding value in the lower limit array;

(b) setting the address of the element in the subsequent block of data to the corresponding value in the upper limit array when it is determined that the address for the corresponding element in the previous block is equal to the corresponding value of the lower limit array;

(c) setting the address of the element in the subsequent block of data to a value that is indexed from the address of the corresponding element in the previous block by a designated index amount when it is determined that the address of the corresponding element in the previous block is not equal to the corresponding value in the lower limit array; and (d) repeating steps (a)–(c) for additional subsequent blocks of data.

14. A method as recited in claim 13 wherein the designated index amount is a decrement by one.

15. A method as recited in claim 13 wherein the designated index amount is an increment by one.

16. A method as recited in claim 11 wherein the predetermined delay associated with the first symbol in the designated block is one.

17. A method as recited in claim 11 wherein the plurality of delay related arrays includes a first delay related array and a second delay related array.

18. A method as recited in claim 17 wherein the first delay related array (B) and the second delay related array (C) are calculated using the substeps of:

setting a first element $BI[0]$ in a first inverse delay related array equal to zero;

setting a first element $CI[0]$ in a second inverse delay related array equal to one;

iterating through the first and second inverse delay related arrays to sequentially set values for remaining elements in the first and second inverse delay related arrays, wherein when it is determined that a value equivalent to $CI[i]+d-1>N$, then the values of the next elements in the first and second inverse delay related arrays are effectively set according to the formulas:

$$CI[i+1]=CI[i]+d-1-N$$

$$BI[i+1]=BI[i]+1$$

and wherein when it is determined that the value equivalent to $CI[i]+d-1<N$, then the values of the next elements in the first and second inverse delay related arrays are effectively set according to the formulas:

$$CI[i+1]=CI[i]+d-1$$

$$BI[i+1]=BI[i];$$

and, iterating through the first and second delay related arrays to sequentially set values for each element in the first delay related array and each element in the second delay related array, wherein when it is determined that a value equivalent to $N-1+i+CI[N-1-i]>N$, then the values of the elements in the first and second delay related arrays are effectively set according to the formulas:

$$C[N-1-i+CI[N-1-i]-N]=CI[i]$$

$$B[N-1-i+CI[N-1-i]-N]=BI[i]$$

and wherein when it is determined that the value equivalent to $N-1+i+CI[N-1-i]$
$<N$, then the values of the next elements in the first and second delay related arrays are effectively set according to the formulas:

$$C[N-1-i+CI[N-1-i]]=CI[i]$$

$$B[N-1-i+CI[N-1-i]]=BI[i].$$

19. A method as recited in claim 11 further comprising the steps of:

determining the elements in the upper limit, lower limit and initial value arrays corresponding to a first one of elements in the block, wherein the difference between the values in the upper limit and lower limit arrays corresponding to the first element in the block define a first orbit;

determining whether any other elements in the block share the first orbit and setting the upper limit, lower limit and initial value arrays corresponding to each additional element in the block that is determined to share the first orbit, wherein each element in the block that is determined to share the first orbit have identical values stored in a corresponding position in the upper limit array and identical values stored in a corresponding position in the lower limit array.

20. A method as recited in claim 19 further comprising determining whether any additional elements in the upper limit, lower limit and initial value arrays need to be filled in and when it is determined that additional elements in the upper limit, lower limit and initial value arrays need to be filled in, the method further comprises the steps of:

(a) determining the elements in the upper limit, lower limit and initial value arrays corresponding to a selected unprocessed one of the elements in the block, wherein the difference between the values in the upper limit and lower limit arrays corresponding to the selected unprocessed element in the block define an additional orbit;

(b) determining whether any other elements in the block share the additional orbit and setting the upper limit, lower limit and initial value arrays corresponding to each additional element in the block that is determined to share the additional orbit, wherein each element in the block that is determined to share the additional orbit has identical values stored in the corresponding position in the upper limit array and identical values stored in the corresponding position in the lower limit array; and, repeating steps (a) and (b) until all of the elements in the block are processed.

21. A convolutional interleaver arranged to convolutionally interleave an incoming stream of data and output an interleaved stream of bits, the stream of bits being conceptually partitioned into blocks, the interleaver comprising:

memory arranged to temporarily store received data bits during an interleaving process;

an address generator arranged to generate a sequence of addresses used to write the incoming stream of data into the memory and to read the interleaved stream of bits from the memory using an upper limit array, a lower limit array and an initial value array, wherein the addresses are generated using the steps of setting the addresses for a first received block of data equal to addresses identified in the initial value array and for each element in each subsequent block of data, (a) determining whether an address for a corresponding element in an immediately preceeding block is equal to a corresponding value in the lower limit array;

(b) setting the address of the element in the subsequent block of data to the corresponding value in the upper limit array when it is determined that the address for the corresponding element in the previous block is equal to the corresponding value of the lower limit array;

(c) setting the address of the element in the subsequent block of data to a value that is indexed from the address of the corresponding element in the previous block by a designated index amount when it is determined that the address of the corresponding element in the previous block is not equal to the corresponding value in the lower limit array; and (d) repeating steps (a)–(c) for additional subsequent blocks of data.

22. A method of convolutionally interleaving a stream of data, the convolutional interleaving being accomplished at a designated interleaving depth (d) and a designated interleaving block length (N), wherein a first symbol in a designated block has a predetermined delay associated therewith and each subsequent symbol in the designated block has a delay equal to (d−1) more than its predecessor symbol, the method comprising the steps of:

calculating a plurality of delay related arrays each including a number of elements equal to the designated block length, wherein the delay related arrays cooperate with the designated block length to define the delay associated with each symbol in the designated block;

calculating a plurality of orbit defining arrays that define interleaving orbits, wherein the orbit defining arrays are calculated based at least in part upon the delay related arrays; and generating a convolutional interleaving addressing scheme utilizing the orbit defining arrays.

23. A method of convolutionally deinterleaving a stream of data, the convolutional interleaving being accomplished at a designated interleaving depth (d) and a designated interleaving block length (N), wherein a first symbol in a designated block has a predetermined delay associated therewith and each subsequent symbol in the designated block has a delay equal to (d−1) more than its predecessor symbol, the method comprising the steps of:

calculating a plurality of delay related arrays each including a number of elements equal to the designated block length, wherein the delay related arrays cooperate with the designated block length to define the delay associated with each symbol in a given block, calculating a plurality of orbit defining arrays that define interleaving orbits, wherein the orbit defining arrays are calculated based at least in part upon the delay related arrays; and generating a convolutional deinterleaving addressing scheme utilizing the orbit defining arrays.

24. A convolutional interleaver arranged to convolutionally interleave an incoming stream of data and output an interleaved stream of bits, the stream of bits being conceptually partitioned into blocks, the interleaver comprising:

memory arranged to temporarily store received data bits during an interleaving process;

an address generator arranged to generate a sequence of addresses used to write the incoming stream of data into the memory and to read the interleaved stream of bits from the memory using a plurality of orbit defining arrays, wherein the addresses are generated using the steps of setting the addresses for a first received block of data equal to addresses identified in the orbit defining arrays and for each element in each subsequent block of data, (a) determining whether an address for a corresponding element in an immediately preceeding block is equal to a corresponding value defined by the orbit defining arrays;

(b) setting the address of the element in the subsequent block of data to the corresponding value defined at least in part by a first orbit defining array selected from the orbit defining arrays when it is determined that the address for the corresponding element in the previous block is equal to the corresponding value defined at least in part by a second orbit defining array selected from the orbit defining arrays;

(c) setting the address of the element in the subsequent block of data to a value that is indexed from the address of the corresponding element in the previous block by a designated index amount when it is determined that the address of the corresponding element in the previous block is not equal to the corresponding value defined at least in part by the second orbit defining array, and (d) repeating steps (a)–(c) for additional subsequent blocks of data.

\* \* \* \* \*